United States Patent

Yamashita

[11] Patent Number: 5,814,240
[45] Date of Patent: Sep. 29, 1998

[54] METHOD FOR POLISHING A SEMICONDUCTOR WAFER

[75] Inventor: Junichi Yamashita, Miyazaki-gun, Japan

[73] Assignee: Komatsu Electronic Metals Co., Ltd., Hiratsuka, Japan

[21] Appl. No.: 805,676

[22] Filed: Feb. 27, 1997

[30] Foreign Application Priority Data

Feb. 29, 1996 [JP] Japan .................................... 8-084455

[51] Int. Cl.⁶ ........................................................ B44C 1/22
[52] U.S. Cl. .............................. 216/88; 156/345; 438/692
[58] Field of Search .............................. 156/345; 216/88; 438/692

[56] References Cited

U.S. PATENT DOCUMENTS

| 5,409,770 | 4/1995 | Netsu et al. | 428/310.5 |
| 5,573,448 | 11/1996 | Nakazima et al. | 451/41 |
| 5,635,083 | 6/1997 | Breivogel et al. | 216/88 |

FOREIGN PATENT DOCUMENTS

| 60023664 | 2/1994 | Japan . |
| 70058066 | 3/1995 | Japan . |
| 7-263386 | 10/1995 | Japan . |
| 8-339982 | 12/1996 | Japan . |

*Primary Examiner*—Nam Nguyen
*Assistant Examiner*—George Goudreau
*Attorney, Agent, or Firm*—Varndell Legal Group

[57] ABSTRACT

A method for polishing a semiconductor wafer, which can prevent from occurring a sloped edge at a peripheral portion of the semiconductor wafer and produce a semiconductor wafer of high-flatness, is provided.

The polishing method utilizes a polishing block consisting of a ceramic plate 11, a backing pad 12 and a template 13. The backing pad 12 has a larger compression rate than that of the polishing cloth 2. The polishing block 1 is mounted on a semiconductor wafer 3. The semiconductor wafer 3 is pressed against the polishing cloth 2 to perform the polishing.

4 Claims, 3 Drawing Sheets

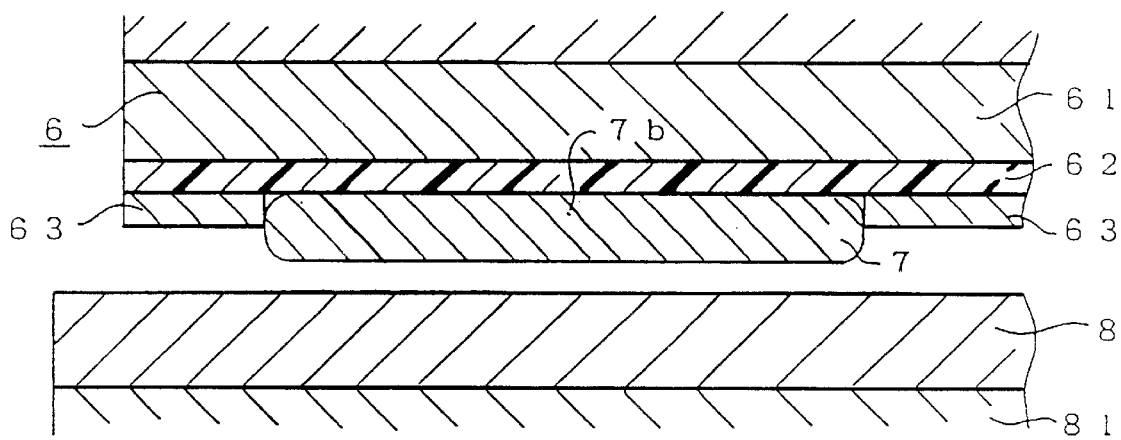
F I G. 3(a)
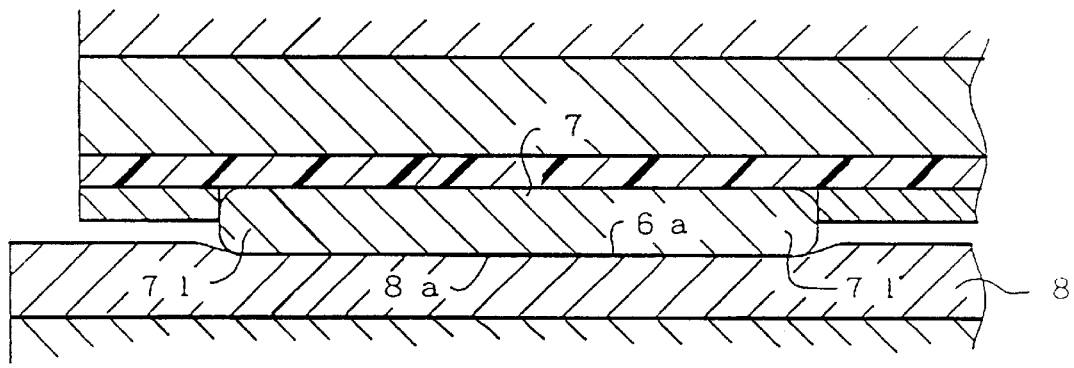
F I G. 3(b)
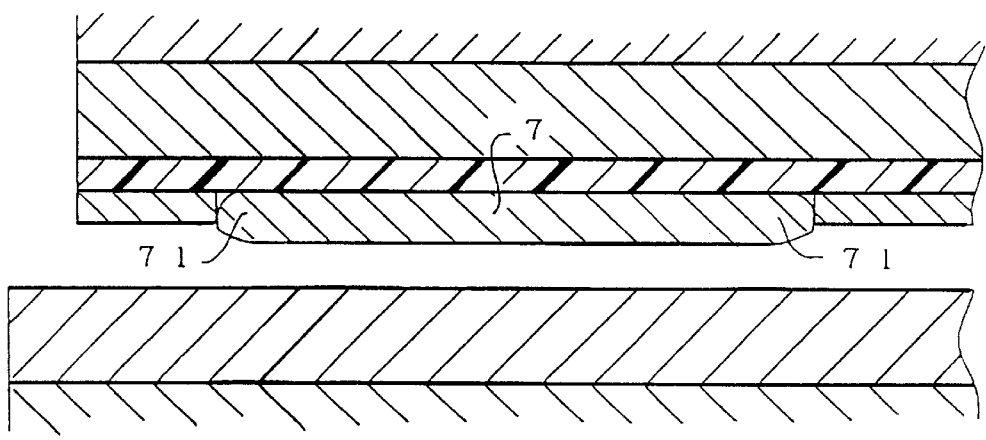
F I G. 3(c)

METHOD FOR POLISHING A SEMICONDUCTOR WAFER

BACKGROUND OF THE INVENTION

1. Field of the Invention

The present invention relates to a method for polishing a semiconductor wafer.

2. Description of the Prior Art

Conventionally, when a front-side surface of a semiconductor wafer is to be polished with a pressure, it is brought to a polishing apparatus with a back-side surface thereof being adhered to a ceramic adhering block by wax, and the front-side surface thereof to be polished brought in contact with a polishing cloth.

However, the wax polishing process which uses wax necessitates the step of adhering the semiconductor wafer prior to the polishing and the steps of peeling the semiconductor wafer off and removing the wax after the polishing, and hence is not efficient. Moreover, it is necessary to use waxpeeling agents which are detrimental to one's health.

Therefore, recently, a waxless polishing process which does not use wax, has been widely utilized.

One waxless polishing process is shown in Fig.3(a), in which a polishing block 6 consisting of a ceramic plate 61, a backing pad 62 and a template 63 is utilized. The polishing is conducted by positioning and holding the peripheral portion of a semiconductor wafer 7 with the template 63, contacting a back-side surface thereof 7b with the backing pad 62 and then pressing the front-side surface 6a to be polished against a polishing cloth 8, as shown in FIG. 3(b). That is, without using any waxes, a plurality of semiconductor wafers can be polished simultaneously and efficiently. Moreover, it is not necessary to use any dissolvents.

However, in the polishing process using the polishing block 6, since the polishing cloth 8 mounted to the lower plate 81 is elastic, as shown in FIG. 3(b), the surface 8a in contact with the semiconductor wafer 7 is recessed, and thus the pressing load is not uniformly distributed and concentrated on the peripheral portion 71. Accordingly, at the peripheral portion 71 of the polished semiconductor wafer 7, a problem of forming sloped edge exists.

SUMMARY OF THE INVENTION

In view of the above-mentioned problem, the object of the present invention is to provide a polishing method for a semiconductor wafer, which can prevent from occurring a sloped edge at the peripheral portion of the polished semiconductor wafer and can produce semiconductor wafers of high-flatness.

According to the invention, the polishing method for a semiconductor wafer includes holding a semiconductor wafer with a polishing block consisting of a ceramic plate, a backing pad and a template, pressing the semiconductor wafer against a polishing cloth and polishing, in which the compression rate of the backing pad is greater than the compression rate of the polishing cloth.

BRIEF DESCRIPTION OF THE DRAWINGS

The embodiment of the present invention is hereinafter described with reference to the drawings, in which

FIGS. 3(a) to 3(c) is a sectional view showing the prior art polishing method.

DESCRIPTION OF THE PREFERRED EMBODIMENT

Figure 1A:
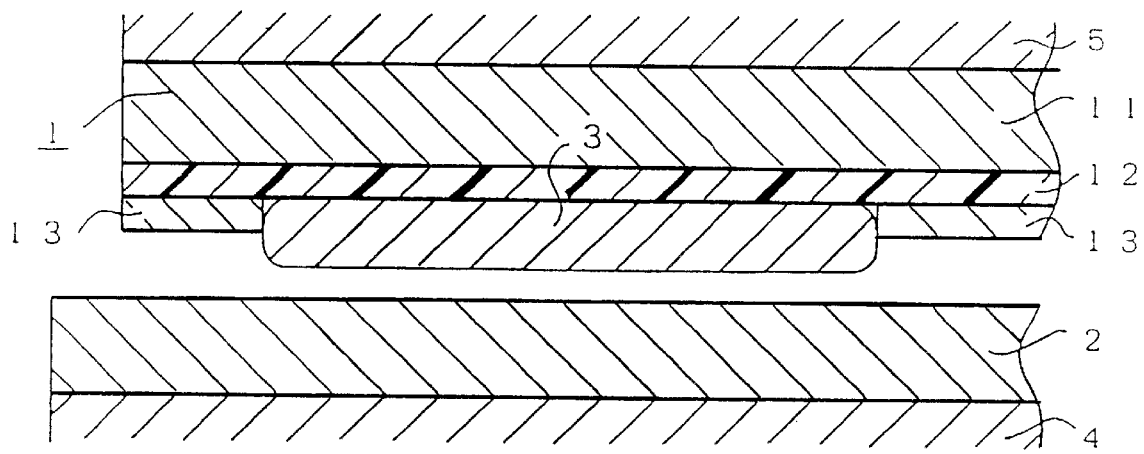
FIGS. 1(a) to 1(c) is a sectional view showing the polishing method of the invention.

As shown in Fig.1(a), according to the polishing method of the preferred embodiment, a semiconductor wafer 3 is mounted on a polishing block 1 consisting of a ceramic plate 11, a backing pad 12 and a template 13. Then, the semiconductor wafer 3 is pressed against the polishing cloth 2 adhered to a lower base plate 4 by a pressing plate 5 and thus is polished. The backing pad 12 used has a compression rate greater than that of the polishing cloth 2.

Figure 1B:
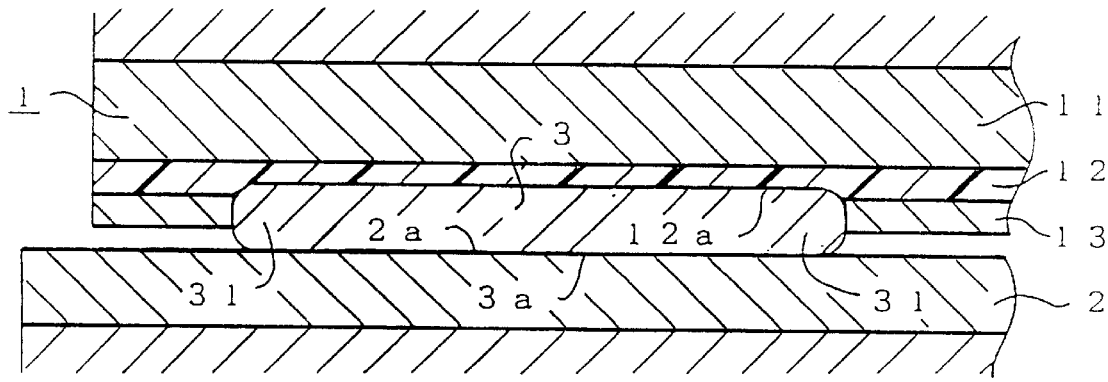

Thus, as shown in FIG. 1(b), when the semiconductor wafer 3 is pressed against the polishing cloth 2, the pad-contacting surface 12a of the backing pad 12 in contact with the semiconductor wafer 3 is recessed. Accordingly, the recess formed in the side of polishing cloth 2 as occurs in the prior art is not formed, and therefore the cloth-contacting surface 2a of the polishing cloth 2 in contact with the semiconductor wafer 3 can remain flat. For this reason, the polished surface 3a of the semiconductor wafer 3 is polished with the pressing load exerted thereto being uniformly distributed.

Figure 1C:
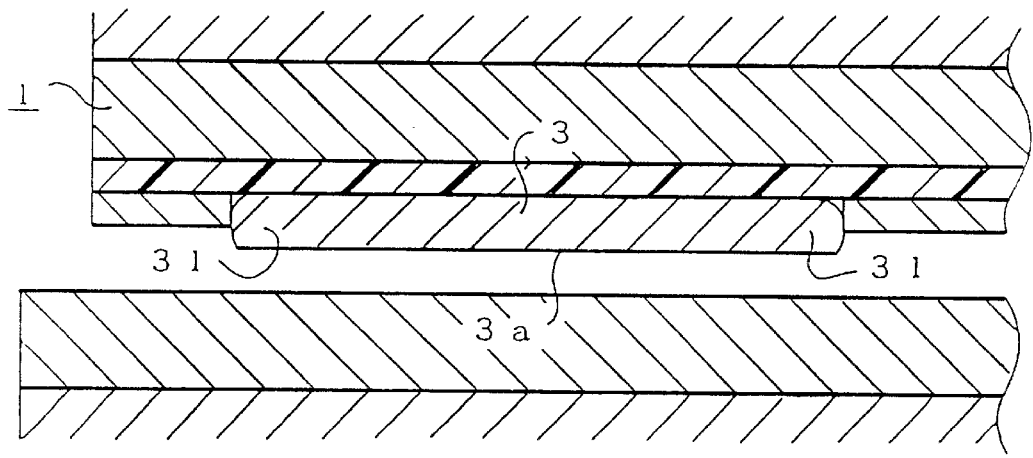

As shown in FIG. 1(c), when the polishing is finished and the polishing block 1 is lifted, no sloped edge occurs at the peripheral portion 31 of the semiconductor wafer 3, and a polished surface 3a of high-flatness is obtained.

Moreover, the compression rates of the polishing cloth 2 and the backing pad 12 are determined in accordance with JIS L-1096, and the units thereof are expressed in terms of %.

Although, by using a backing pad 12 which has a greater compression rate than that of the polishing cloth 2, a polished semiconductor wafer 3 of high-flatness is obtained, so as to make the backing pad 12 sufficiently recessed. It is desirable to keep the difference of the compression rate between the polishing cloth 2 and the backing pad 12 at a minimum of 0.5% so as to make the backing pad 12 sufficiently recessed.

On the other hand, if the compression rate of the backing pad 12 is too large, the peripherial portion 31 becomes unpolished. It is therefore desirable to keep the difference of the compression rate at less than 3.0%.

Furthermore, in consideration of manufacturing efficiency and the finished state of the polishing surface 3 such as microroughness, it is desirable to keep the compression rate of the polishing cloth 2 between 2.0–5.0% and the compression rate of the backing pad 12 between 3.0–8.0%.

Example

Figure 2:
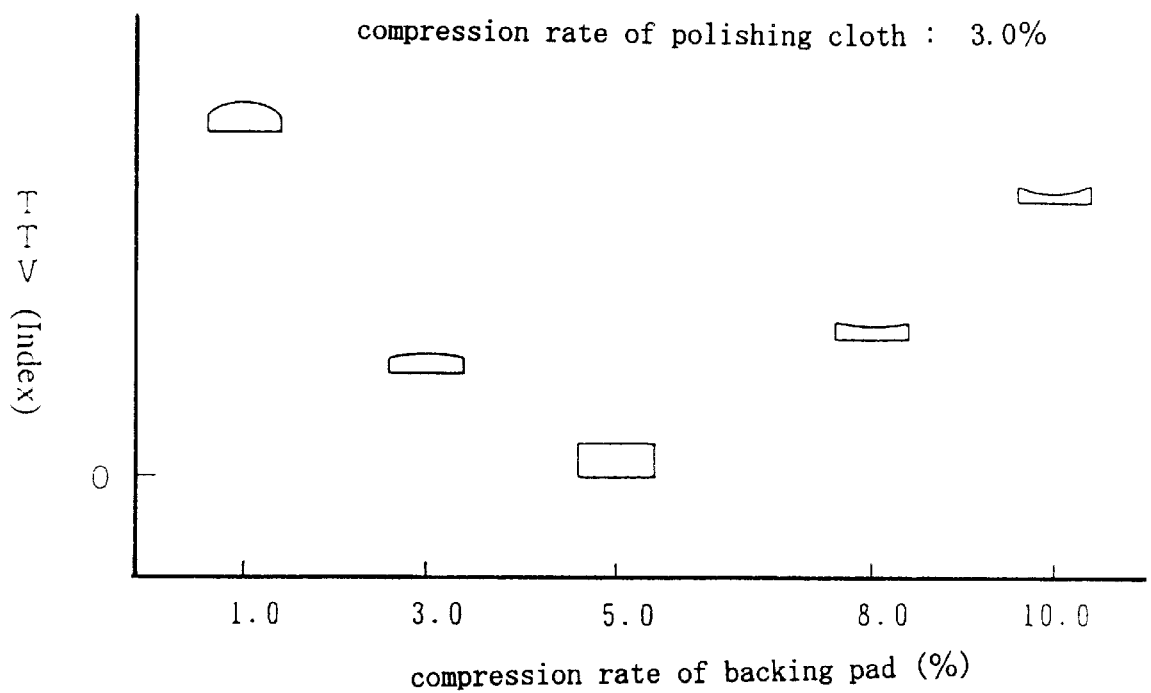
FIG. 2 is a graph comparing the degree of the sloped edge according to the embodiment.

In this example, a polishing cloth having a compression rate of 3.0% and backing pads having compression rates of 1.0%, 3.0%, 5.0%, 8.0% and 10.0% respectively were used to conduct the polishing of semiconductor wafers, and the flatness of the polished semiconductor wafers was measured. The results are shown graphically in terms of TTV (Total Thickness Variation) index. As shown in FIG. 2, polishing using a backing pad having a compression rate of 5.0% can obtain the highest flatness. In polishings using backing pads having compression rates of 1.0% and 3.0%, sloped edges occur. On the other hand, for polishings using backing pads having compression rates of 8.0% and 10.0%, the polished semiconductors are centrally recessed. The larger the difference of the compression rate, the larger the TTV index.

The invention is constructed as above and accordingly has the advantages of preventing the formation of sloped edge occurred in the peripheral portion of the polished semiconductor wafers and producing a polished semiconductor wafer of high-flatness.

What is claimed is:

1. A method for polishing a semiconductor wafer, comprising holding the semiconductor wafer with a polishing block consisting of a ceramic plate, a backing pad and a template, and pressing the semiconductor wafer against a polishing cloth, characterized in that the compression rate of said backing pad is greater than the compression rate of said polishing cloth.

2. The method as claimed in claim 1, characterized in that the difference between the compression rate of said polishing cloth and the compression rate of said backing pad is 0.5–3.0% in accordance with JIS L-1096.

3. The method as claimed in claim 1, characterized in that the compression rate of said backing pad is 3–8% in accordance with JIS L-1096.

4. The method as claimed in claim 1, characterized in that the compression rate of said polishing cloth is 2–5% in accordance with JIS L-1096.

* * * * *